(12) United States Patent
Michiyoshi

(10) Patent No.: US 8,391,511 B2
(45) Date of Patent: Mar. 5, 2013

(54) SEMICONDUCTOR DEVICE

(75) Inventor: Takshi Michiyoshi, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 703 days.

(21) Appl. No.: 12/664,959

(22) PCT Filed: Sep. 1, 2008

(86) PCT No.: PCT/JP2008/066138
§ 371 (c)(1),
(2), (4) Date: Dec. 16, 2009

(87) PCT Pub. No.: WO2009/034935
PCT Pub. Date: Mar. 19, 2009

(65) Prior Publication Data
US 2010/0183168 A1    Jul. 22, 2010

(30) Foreign Application Priority Data

Sep. 13, 2007 (JP) ................................ 2007-238015

(51) Int. Cl.
*H03G 5/00* (2006.01)
*H04R 3/00* (2006.01)

(52) U.S. Cl. .......... 381/98; 381/111; 381/117; 330/251; 331/46

(58) Field of Classification Search .................... 381/98, 381/97, 111, 116, 117; 330/10, 251, 207 A; 331/44, 46, 47, 48
See application file for complete search history.

(56) References Cited

U.S. PATENT DOCUMENTS

| | | | |
|---|---|---|---|
| 4,634,956 A * | 1/1987 | Davis et al. ................... | 323/222 |
| 5,784,475 A * | 7/1998 | Huang et al. .................. | 381/104 |
| 5,832,438 A | 11/1998 | Bauer | |
| 6,320,298 B1 | 11/2001 | Kawabe | |
| 6,831,508 B2 * | 12/2004 | Shima .............................. | 330/10 |
| 7,110,737 B2 * | 9/2006 | Sawashi et al. ............ | 455/245.1 |
| 7,957,489 B2 * | 6/2011 | Suzuki ........................... | 375/316 |
| 8,212,598 B2 * | 7/2012 | Michiyoshi ................... | 327/156 |

(Continued)

FOREIGN PATENT DOCUMENTS

| | | |
|---|---|---|
| JP | 2000-50660 | 2/2000 |
| JP | 2000-165205 | 6/2000 |

(Continued)

OTHER PUBLICATIONS

May 22, 2012 Japanese office action of the Japanese Patent Office in connection with a corresponding Japanese patent application.

(Continued)

*Primary Examiner* — Xu Mei
(74) *Attorney, Agent, or Firm* — Cooper & Dunham LLP

(57) ABSTRACT

A semiconductor device is disclosed. The semiconductor device includes a digital audio circuit which converts an input digital signal into an analog audio signal, a DC-DC converter having a switching power source circuit, and an audible frequency determining circuit. In order that a difference between a frequency of a first clock signal for digital to analog conversion which is used in the digital audio circuit and a frequency of a second clock signal for switching control which is used in a DC-DC converter exceeds a maximum audible frequency, a frequency comparing circuit in the audible frequency determining circuit outputs a signal to a frequency changing circuit in the DC-DC converter. The frequency changing circuit causes a second oscillating circuit to change the second frequency.

8 Claims, 3 Drawing Sheets

U.S. PATENT DOCUMENTS

| | | |
|---|---|---|
| 2003/0216132 A1 | 11/2003 | Sawashi et al. |
| 2006/0092063 A1 | 5/2006 | Ido et al. |
| 2007/0252644 A1 | 11/2007 | Ohama et al. |
| 2008/0080726 A1* | 4/2008 | Chen et al. .................... 381/120 |

FOREIGN PATENT DOCUMENTS

| | | |
|---|---|---|
| JP | 2002-76903 | 3/2002 |
| JP | 2002-223132 | 8/2002 |
| JP | 2004-48701 | 2/2004 |
| JP | 2004-128662 | 4/2004 |
| JP | 2006-60580 | 3/2006 |
| JP | 2006-93749 | 4/2006 |
| JP | 2006-129366 | 5/2006 |

OTHER PUBLICATIONS

Apr. 11, 2011 Korean search report (with English translation) in connection with a counterpart Korean patent application.

* cited by examiner

SEMICONDUCTOR DEVICE

TECHNICAL FIELD

The present invention generally relates to a semiconductor device which includes a digital audio circuit and a DC-DC converter formed of, for example, a switching regulator for supplying a power source to the digital audio circuit.

BACKGROUND ART

As a conventional technology with respect to a digital audio circuit and a power source circuit for supplying a power source to the digital audio circuit, Patent Document 1 discloses an audio reproducing apparatus. The audio reproducing apparatus provides a control loop which detects a fluctuation of a power source voltage of a power amplifier and feed backs the fluctuation to a switching regulator; and another control loop which feed-forwards a signal generated from a PWM signal for controlling the power amplifier to the switching regulator. That is, the apparatus provides the feed-forward control, in addition to the feedback control. With this configuration, the fluctuation of the power source voltage can be accurately controlled.

In addition, Patent Document 2 discloses a digital amplifier. The digital amplifier provides a constant voltage power source circuit for supplying a power source voltage to an output amplifying stage, and a modulation circuit which compares a PCM multi-bit digital audio input signal with an output signal from the output amplifying stage and modulates an output from the constant voltage power source circuit based on the comparison result. With this, a distortion from the output amplifying stage is decreased.

In the conventional technology, the fluctuation of the output voltage from the power source circuit is corrected corresponding to the audio output; however, the frequency of a switching clock signal of the switching regulator serving as a DC-DC converter has not been considered.

FIG. 2 is a block diagram showing a conventional digital audio system.

As shown in FIG. 2, the digital audio system provides a digital audio circuit 101, a DC-DC converter 102 which is a power source circuit, and a speaker SP.

The digital audio circuit 101 provides a first oscillating circuit 111, a digital filter 112, a ΔΣ modulator 113, a D/A converter 114, and an output amplifier (AMP) 115. The DC-DC converter 102 provides a second oscillating circuit 121 and a control circuit 122.

The DC-DC converter 102 outputs an output voltage Vdd generated from an input voltage Vin as a power source to the circuits in the digital audio circuit 101. A first clock signal CLKA output from the first oscillating circuit 111 is input to the D/A converter 114, and is used as a clock signal when the D/A converter 114 converts a digital signal into an analog signal. A second clock signal CLKB output from the second oscillating circuit 121 is input to the control circuit 122, and is used for ON/OFF control of a switching element (not shown) in the control circuit 122.

[Patent Document 1] Japanese Laid-Open Patent Application No. 2002-223132
[Patent Document 2] Japanese Laid-Open Patent Application No. 2004-128662

FIG. 3 is a graph showing frequency components of noise generated at the AMP 115.

As shown in FIG. 3, when the frequency of the first clock signal CLKA output from the first oscillating circuit 111 is 2.0 MHz and the frequency of the second clock signal CLKB output from the second oscillating circuit 111 is 2.001 MHz, large noise components are generated at the corresponding frequencies of 2.0 MHz and 2.001 MHz. Further, a noise component is generated at the frequency of 1 kHz which is a difference between the frequencies of 2.0 MHz and 2.001 MHz.

It can be said that the audible frequency range of a person is from 20 Hz to 20 kHz. Therefore the person cannot hear the noise components of the frequencies of 2.0 MHz and 2.001 MHz. However, the person can hear the nose component of the frequency of 1 kHz.

As the first oscillating circuit ill whose oscillated frequency is used by the D/A converter 114, a crystal oscillating circuit is generally used in which the oscillating frequency is highly stable. However, in many cases, as the second oscillating circuit 121 in the DC-DC converter 102, a low-cost CR oscillating circuit is used. In the CR oscillating circuit, the frequency most likely fluctuates when the driving voltage fluctuates and/or the temperature fluctuates. In addition, the oscillating frequency of the CR oscillating circuit disperses in the manufacturing process. When the difference between the frequencies of the first clock signal CLKA and the second clock signal CLKB is not large and becomes the maximum audible frequency of 20 kHz or less caused by the temperature fluctuation and/or the manufacturing dispersion, a noise signal within the audible frequency range is output from the AMP 115. Consequently, the person hears the frequency as noise.

DISCLOSURE OF THE INVENTION

In an embodiment of the present invention, there is provided a semiconductor device which can remove a noise signal in the audible frequency range generated by a difference between a first clock signal in a digital audio circuit and a second clock signal in a DC-DC converter.

To achieve one or more of these and other advantages, according to one aspect of the present invention, there is provided a semiconductor device. The semiconductor device includes a digital audio circuit which converts an input digital signal into an analog audio signal and a DC-DC converter having a switching power source circuit. The semiconductor device further includes a first oscillating circuit which generates a first clock signal of a first frequency which is used when the digital audio circuit converts the input digital signal into the analog audio signal, a second oscillating circuit which generates a second clock signal of a second frequency which is used when switching control is applied to a switching element in the switching power source circuit, an audible frequency determining circuit which determines whether an absolute value of a difference between the first frequency and the second frequency is a predetermined maximum audible frequency or less, and a frequency changing circuit which causes the second oscillating circuit to change the second frequency of the second clock signal based on a result determined by the audible frequency determining circuit. The frequency changing circuit causes the second oscillating circuit to change the second frequency of the second clock signal so that the absolute value of the difference between the first frequency and the second frequency is greater than the maximum audible frequency based on the result determined by the audible frequency determining circuit.

According to another aspect of the present invention, there is provided a semiconductor device. The semiconductor device includes a digital audio circuit which converts an input digital signal into an analog audio signal and a DC-DC converter having a switching power source circuit. The semiconductor device further includes a first oscillating circuit which generates a first clock signal of a first frequency which is used when the digital audio circuit converts the input digital signal into the analog audio signal, a second oscillating circuit which generates a second clock signal of a second frequency which is used when switching control is applied to a switching element in the switching power source circuit, an audible frequency determining circuit which determines whether an absolute value of a difference between the first frequency and the second frequency is a predetermined maximum audible frequency or less, and a frequency changing circuit which causes the first oscillating circuit to change the first frequency of the first clock signal based on a result determined by the audible frequency determining circuit. The frequency changing circuit causes the first oscillating circuit to change the first frequency of the first clock signal so that the absolute value of the difference between the first frequency and the second frequency is greater than the maximum audible frequency based on the result determined by the audible frequency determining circuit.

According to an embodiment of the present invention, a semiconductor device includes a digital audio circuit which converts an input digital signal into an analog audio signal, a DC-DC converter having a switching power source circuit, and an audible frequency determining circuit. In order that a difference between a frequency of a first clock signal for digital to analog conversion which is used in the digital audio circuit and a frequency of a second clock signal for switching control which is used in a DC-DC converter exceeds a maximum audible frequency, a frequency comparing circuit in the audible frequency determining circuit outputs a signal to a frequency changing circuit in the DC-DC converter. The frequency changing circuit causes a second oscillating circuit to change the second frequency. Therefore, unwanted noise in the audible frequency range in an audio signal can be prevented and clear sound quality can be obtained.

The features and advantages of the present invention will become more apparent from the following detailed description of a preferred embodiment given with reference to the accompanying drawings.

BEST MODE FOR CARRYING OUT THE INVENTION

Figure 1:
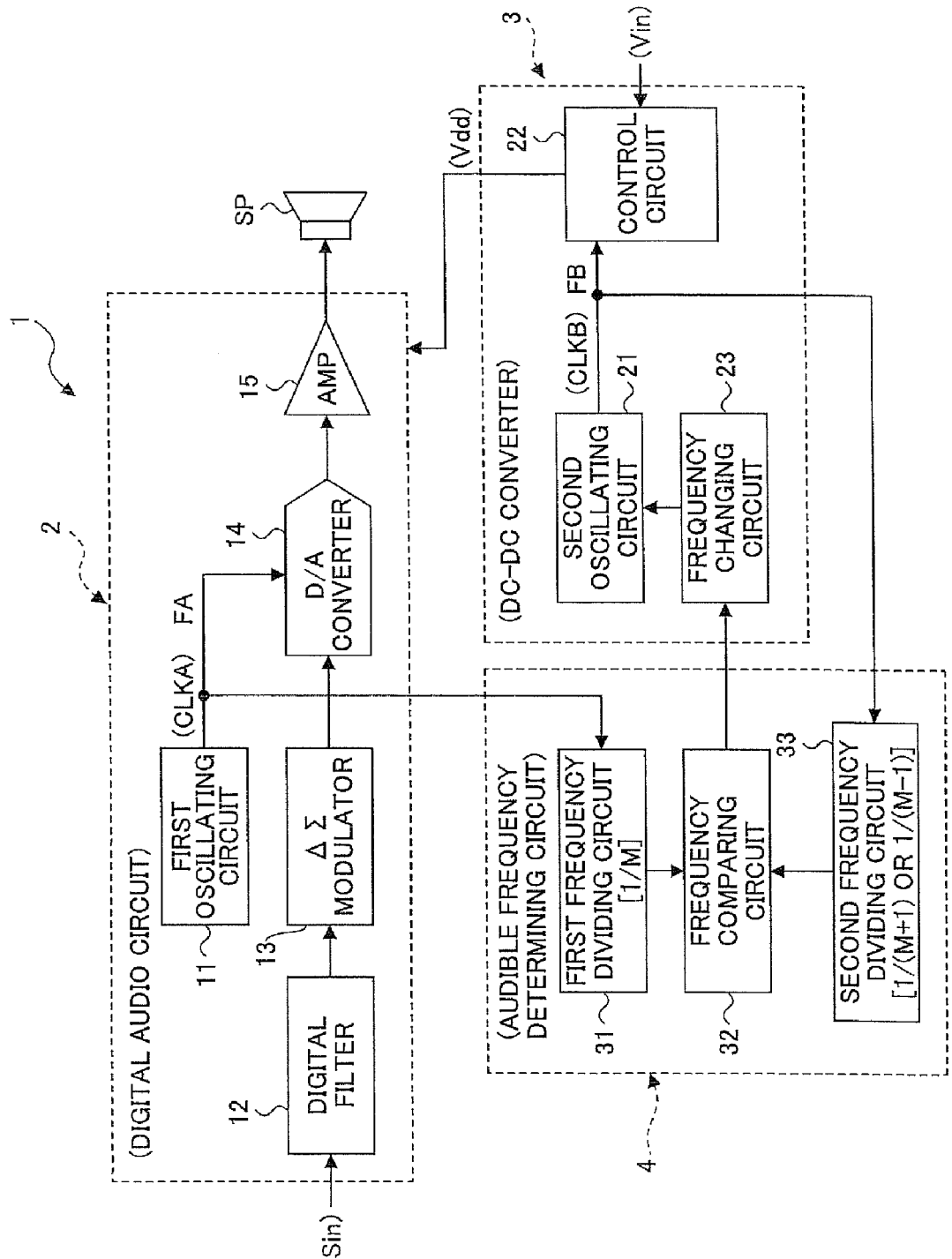
FIG. 1 is a block diagram showing a semiconductor device according to an embodiment of the present invention.
Figure 2:
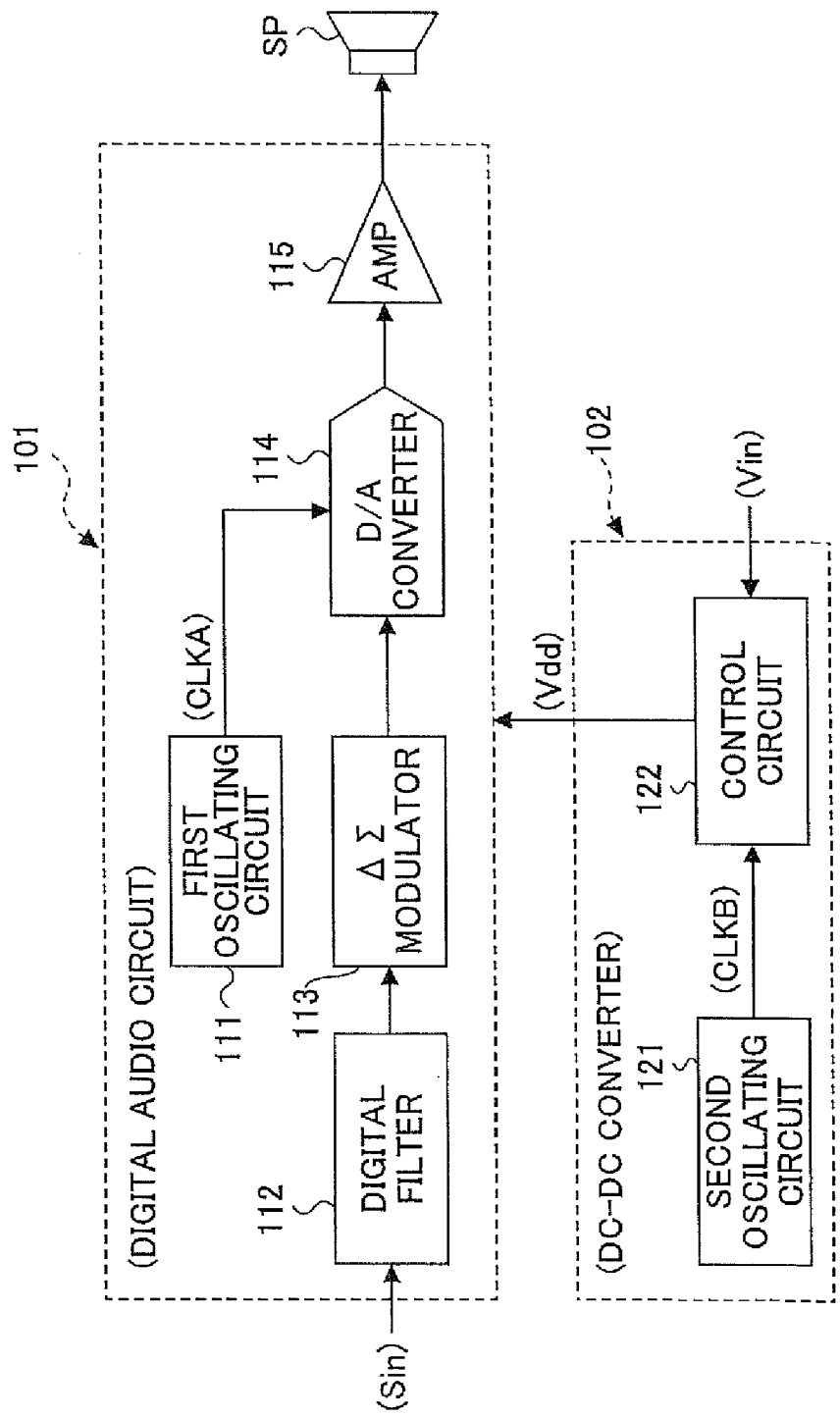
FIG. 2 is a block diagram showing a conventional digital audio system.
Figure 3:
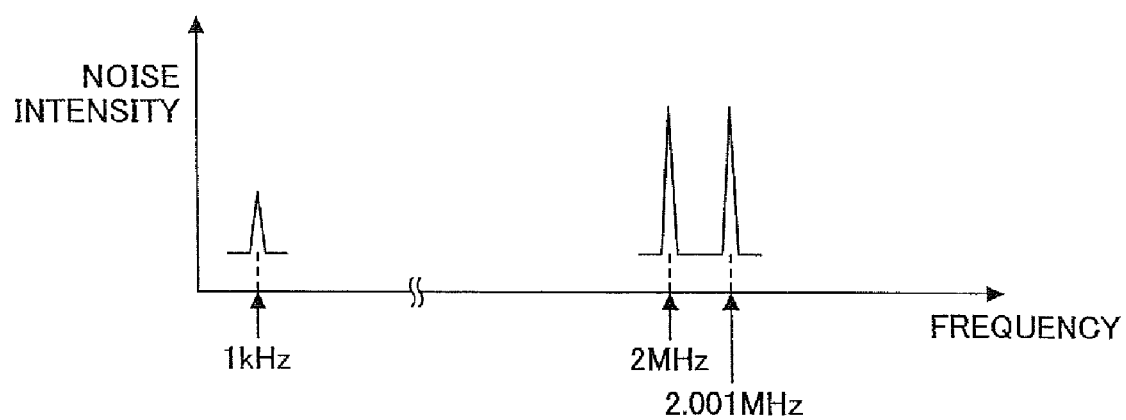
FIG. 3 is a graph showing frequency components of noise generated at an AMP shown in FIG. 2.

Referring to FIG. 1, an embodiment of the present invention is described in detail.

FIG. 1 is a block diagram showing a semiconductor device 1 according to the embodiment of the present invention.

As shown in FIG. 1, the semiconductor device 1 includes a digital audio circuit 2, a DC-DC converter 3 which is a switching power source circuit such as a switching regulator, an audible frequency determining circuit 4, and a speaker SP.

The digital audio circuit 2 includes a first oscillating circuit 11, a digital filter 12, a ΔΣ modulator 13, a D/A converter 14, and an output amplifier (AMP) 15. The DC-DC converter 3 includes a second oscillating circuit 21, a control circuit 22, and a frequency changing circuit 23. The audible frequency determining circuit 4 includes a first frequency dividing circuit 31, a frequency comparing circuit 32, and a second frequency dividing circuit 33.

A digital input signal Sin input to the digital audio circuit 2 is input to the D/A converter 14 via the digital filter 12 and the ΔΣ modulator 13. The digital signal input to the D/A converter 14 is converted into an analog audio signal by the D/A converter 14. The analog audio signal is amplified by the AMP 15, and the amplified analog audio signal is converted into a sound by the speaker SP.

The first oscillating circuit 11 generates a first clock signal CLKA of a predetermined frequency FA (first frequency) and outputs the first clock signal CLKA. The first clock signal CLKA is input to the D/A converter 14 and is used as a clock signal for D/A conversion.

The DC-DC converter 3 converts an input voltage Vin into a power source voltage Vdd having a predetermined constant voltage and supplies the power source voltage Vdd to the circuits in the digital audio circuit 2.

The second oscillating circuit 21 generates a second clock signal CLKB of a predetermined frequency FB (second frequency) and outputs the second clock signal CLKB. The second clock signal CLKB is input to the control circuit 22 and is used as a clock signal for ON/OFF control of a switching element (not shown) in the control circuit 22. The control circuit 22 generates the power source voltage Vdd by converting the input voltage Vin with use of the second clock signal CLKB. The frequency changing circuit 23 causes the second oscillating circuit 21 to change the frequency FB of the second clock signal CLKB based on the result determined by the audible frequency determining circuit 4.

In the audible frequency determining circuit 4, the first clock signal CLKA is input to the first frequency dividing circuit 31 from the first oscillating circuit 11. In the first frequency dividing circuit 31, the frequency dividing ratio is determined so that the frequency FA of the input first clock signal CLKA becomes the maximum audible frequency of 20 kHz or more, and the frequency dividing ratio is defined as 1/M (M>1). The second clock signal CLKB is input to the second frequency dividing circuit 33 from the second oscillating circuit 21, and the frequency dividing ratio in the second frequency dividing circuit 33 is determined to be 1/(M+1) or 1/(M−1). Specifically, when the frequency FB of the second clock signal CLKB is greater than the frequency FA of the first clock signal CLKA, the frequency dividing ratio in the second frequency dividing circuit 33 is determined to be 1/(M+1), and when the frequency FB of the second clock signal CLKB is less than the frequency FA of the first clock signal CLKA, the frequency dividing ratio in the second frequency dividing circuit 33 is determined to be 1/(M−1).

Signals output from the first and second frequency dividing circuits 31 and 33 are input to the frequency comparing circuit 32. The frequency comparing circuit 32 compares the frequency of the signal output from the first frequency dividing circuit 31 with the frequency of the signal output from the second frequency dividing circuit 33, and generates a signal indicating the compared result and outputs the generated signal to the frequency changing circuit 23. The frequency changing circuit 23 controls the frequency FB of the second clock signal CLKB to be output from the second oscillating circuit 21. As the frequency comparing circuit 32, for example, a phase comparator which is used in a PLL circuit can be used.

Next, operating examples of the semiconductor device 1 are described.

First Operating Example

In the first operating example, the frequency FB is greater than the frequency FA, for example, the frequency FA is 2.0

MHz and the frequency FB is 2.03 MHz. In the first operating example, since the absolute value of the difference between the frequencies FA and FB is 30 kHz, the difference 30 kHz is over the maximum audible frequency of 20 kHz. When the first frequency dividing circuit 31 determines the frequency dividing ratio so that the frequency FA of the first clock signal CLKA becomes the maximum audible frequency of 20 kHz, the frequency dividing ratio of the first frequency dividing circuit 31 is determined to be 20/2000=1/100; that is M=100. In addition, since the frequency FB is greater than the frequency FA, the frequency dividing ratio of the second frequency dividing circuit 33 is determined to be 1/(M+1); that is, 1/101.

The frequency in which the frequency FB is divided by the second frequency dividing circuit 33 is 2030/101≈20.1 kHz. Since the frequency of 20.1 kHz is greater than the frequency of 20 kHz of the signal to be output from the first frequency dividing circuit 31, the frequency comparing circuit 32 outputs a low level signal. When the low level signal is input to the frequency changing circuit 23, the frequency changing circuit 23 does not cause the second oscillating circuit 21 to change the frequency FB.

Next, when the frequency FB 2.03 MHz falls to 2.019 MHz caused by an influence of, for example, a temperature change; the absolute value of the difference between the frequencies FA and FB is 19 kHz, and the difference 19 kHz is less than the maximum audible frequency of 20 kHz. The frequency of the signal output from the second frequency dividing circuit 33 is 2019/101≈19.99 kHz. Since the frequency of 19.99 kHz is less than the frequency of 20 kHz of the signal to be output from the first frequency dividing circuit 31, the frequency comparing circuit 32 outputs a high level signal.

When the high level signal is input to the frequency changing circuit 23, the frequency changing circuit 23 controls so that the frequency FB to be output from the second oscillating circuit 21 becomes high. As a result, the frequency changing circuit 23 causes the second oscillating circuit 21 to increase the frequency FB until the frequency of the signal output from the second frequency dividing circuit 33 becomes 20 kHz or more which 20 kHz is the frequency of the signal to be output from the first frequency dividing circuit 31. That is, the frequency FB is controlled so that the frequency FB does not become a frequency less than 2020 kHz=the maximum audible frequency of 20 kHz×the frequency dividing ratio 101 of the second frequency dividing circuit 33. Since the absolute value of the difference between the frequencies FA and FB is always over the maximum audible frequency of 20 kHz, clock noise in the audible frequency range is prevented from being generated in a signal output from the AMP 15. In the above description, the frequency dividing ratio of the first frequency dividing circuit 31 is determined so that the frequency FA becomes the maximum audible frequency of 20 kHz. However, it can be determined that the frequency of the signal output from first frequency dividing circuit 31 is greater than the maximum audible frequency of 20 kHz.

Second Operating Example

In the second operating example, the frequency FB is less than the frequency FA, for example, the frequency FA is 2.0 MHz and the frequency FB is 1.97 MHz. In the second operating example, the absolute value of the difference between the frequencies FA and FB is 30 kHz, and 30 kHz is over the maximum audible frequency of 20 kHz. The frequency dividing ratio of the first frequency dividing circuit 31 is the same as that in the first operating example in which the frequency FB is greater than the frequency FA and is 1/100; that is, M=100. Since the frequency FB is less than the frequency FA, the frequency dividing ratio of the second frequency dividing circuit 33 is determined to be 1/(M−1); that is, 1/99. The frequency in which the frequency FB is divided by the second frequency dividing circuit 33 is 1970/99≈19.9 kHz. The frequency of 19.9 kHz is less than the frequency of 20 kHz of the signal to be output from the first frequency dividing circuit 31, and different from the first operating example, the frequency comparing circuit 32 outputs a low level signal. When the low level signal is input to the frequency changing circuit 23, the frequency changing circuit 23 does not cause the second oscillating circuit 21 to change the frequency FB.

Next, when the frequency FB rises to 1.981 MHz from 1.97 MHz caused by an influence of, for example, a temperature change; the absolute value of the difference between the frequencies FA and FB is 19 kHz, and is less than the maximum audible frequency of 20 kHz. The frequency of a signal output from the second frequency dividing circuit 33 is 1981/99≈20.01 kHz. The frequency of 20.01 kHz is greater than the frequency of 20 kHz to be output from the first frequency dividing circuit 31, and different from the first operating example, the frequency comparing circuit 32 outputs a high level signal. When the high level signal is input to the frequency changing circuit 23, the frequency changing circuit 23 controls so that the frequency FB to be output from the second oscillating circuit 21 becomes low, differently from the first operating example.

As a result, the frequency changing circuit 23 causes the second oscillating circuit 21 to decrease the frequency FB until the frequency of the signal output from the second frequency dividing circuit 33 becomes 20 kHz which 20 kHz is the frequency of the signal output from the first frequency dividing circuit 31. That is, the frequency FB is controlled so that the frequency FB does not become a frequency of 1980 kHz=the maximum audible frequency of 20 kHz×the frequency dividing ratio 99 of the second frequency dividing circuit 33 or more. Since the absolute value of the difference between the frequencies FA and FB is always over the maximum audible frequency of 20 kHz, clock noise in the audible frequency range is prevented from being generated in a signal output from the AMP 15.

According to the embodiment of the present invention, the frequency changing circuit 23 controls only the second oscillating circuit 21 and changes the frequency FB of the second clock signal CLKB. However, a structure can be established in which the frequency changing circuit 23 controls only the first oscillating circuit 11 and changes the frequency FA of the first clock signal CLKB. In addition, another structure can be established in which the frequency changing circuit 23 controls the first and second oscillating circuits 11 and 21 and changes the frequencies FA and FB.

As described above, according to the semiconductor device 1 in the embodiment of the present invention, the first and second oscillating circuits 11 and 21 are controlled corresponding to a signal output from the frequency comparing circuit 32 so that the absolute value of the difference between the frequency FA of the first clock signal CLKA (D/A converting clock signal) of the D/A converter 14 in the digital audio circuit 2 and the frequency FB of the second clock signal CLKB (switching clock signal) in the DC-DC converter 3 becomes over the maximum audible frequency of 20 kHz, and the frequency FA and/or the frequency FB is changed. With this, unwanted noise in the audible frequency range in a signal output from the AMP 15 can be prevented, and clear sound quality can be obtained.

In the above description, the first oscillating circuit 11 is a clock source which is used by the D/A converter 14 in the digital audio circuit 2 and the second oscillating circuit 21 is a clock source which is used in the DC-DC converter 3. However, the embodiment of the present invention can apply to any circuit in which the difference between two frequencies is handled.

Further, the present invention is not limited to the embodiment, but various variations and modifications may be made without departing from the scope of the present invention.

The present invention is based on Japanese Priority Patent Application No. 2007-238015 filed on Sep. 13, 2007, with the Japanese Patent Office, the entire contents of which are hereby incorporated herein by reference.

The invention claimed is:

1. A semiconductor device including a digital audio circuit which converts an input digital signal into an analog audio signal and a DC-DC converter having a switching power source circuit, comprising:
   a first oscillating circuit which generates a first clock signal of a first frequency which is used when the digital audio circuit converts the input digital signal into the analog audio signal;
   a second oscillating circuit which generates a second clock signal of a second frequency which is used when switching control is applied to a switching element in the switching power source circuit;
   an audible frequency determining circuit which determines whether an absolute value of a difference between the first frequency and the second frequency is a predetermined maximum audible frequency or less; and
   a frequency changing circuit which causes the second oscillating circuit to change the second frequency of the second clock signal based on a result determined by the audible frequency determining circuit; wherein
   the frequency changing circuit causes the second oscillating circuit to change the second frequency of the second clock signal so that the absolute value of the difference between the first frequency and the second frequency is greater than the maximum audible frequency based on the result determined by the audible frequency determining circuit.

2. The semiconductor device as claimed in claim 1, wherein:
   the frequency changing circuit causes the second oscillating circuit to increase the second frequency when the second frequency is greater than the first frequency and the absolute value of the difference between the first frequency and the second frequency is the maximum audible frequency or less.

3. The semiconductor device as claimed in claim 1, wherein:
   the frequency changing circuit causes the second oscillating circuit to decrease the second frequency when the first frequency is greater than the second frequency and the absolute value of the difference between the first frequency and the second frequency is the maximum audible frequency or less.

4. The semiconductor device as claimed in claim 2, wherein:
   the audible frequency determining circuit includes
   a first frequency dividing circuit which divides the first frequency of the first clock signal into a 1/M (M>1) frequency and outputs a signal of the divided frequency;
   a second frequency dividing circuit which divides the second frequency of the second clock signal into a 1/(M+1) frequency and outputs a signal of the divided frequency; and
   a frequency comparing circuit which compares the frequency of the signal output from the first frequency dividing circuit with the frequency of the signal output from the second frequency dividing circuit, generates a signal indicating the compared result, and outputs the generated signal to the frequency changing circuit; wherein
   when the frequency comparing circuit outputs a signal indicating that the frequency of the signal output from the second frequency dividing circuit is less than the frequency of the signal output from the first frequency dividing circuit to the frequency changing circuit, the frequency changing circuit causes the second oscillating circuit to increase the second frequency of the second clock signal.

5. The semiconductor device as claimed in claim 3, wherein:
   the audible frequency determining circuit includes
   a first frequency dividing circuit which divides the first frequency of the first clock signal into a 1/M (M>1) frequency and outputs a signal of the divided frequency;
   a second frequency dividing circuit which divides the second frequency of the second clock signal into a 1/(M−1) frequency and outputs a signal of the divided frequency; and
   a frequency comparing circuit which compares the frequency of the signal output from the first frequency dividing circuit with the frequency of the signal output from the second frequency dividing circuit, generates a signal indicating the compared result, and outputs the generated signal to the frequency changing circuit; wherein
   when the frequency comparing circuit outputs a signal indicating that the frequency of the signal output from the second frequency dividing circuit is greater than the frequency of the signal output from the first frequency dividing circuit to the frequency changing circuit, the frequency changing circuit causes the second oscillating circuit to decrease the second frequency of the second clock signal.

6. The semiconductor device as claimed in claim 1, wherein:
   the first oscillating circuit outputs a signal of a frequency more stable than a signal of a frequency to be output from the second oscillating circuit.

7. The semiconductor device as claimed in claim 1, wherein:
   the frequency changing circuit causes the first oscillating circuit to change the first frequency of the first clock signal based on the result determined by the audible frequency determining circuit, and the frequency changing circuit causes the first oscillating circuit to change the first frequency of the first clock signal and causes the second oscillating circuit to change the second frequency of the second clock signal based on the result determined by the audible frequency determining circuit so that the absolute value of the difference between the first frequency and the second frequency is greater than the maximum audible frequency.

8. A semiconductor device including a digital audio circuit which converts an input digital signal into an analog audio signal and a DC-DC converter having a switching power source circuit, comprising:
   a first oscillating circuit which generates a first clock signal of a first frequency which is used when the digital audio circuit converts the input digital signal into the analog audio signal;

a second oscillating circuit which generates a second clock signal of a second frequency which is used when switching control is applied to a switching element in the switching power source circuit;

an audible frequency determining circuit which determines whether an absolute value of a difference between the first frequency and the second frequency is a predetermined maximum audible frequency or less; and a frequency changing circuit which causes the first oscillating circuit to change the first frequency of the first clock signal based on a result determined by the audible frequency determining circuit; wherein the frequency changing circuit causes the first oscillating circuit to change the first frequency of the first clock signal so that the absolute value of the difference between the first frequency and the second frequency is greater than the maximum audible frequency based on the result determined by the audible frequency determining circuit.

* * * * *

UNITED STATES PATENT AND TRADEMARK OFFICE
CERTIFICATE OF CORRECTION

PATENT NO. : 8,391,511 B2
APPLICATION NO. : 12/664959
DATED : March 5, 2013
INVENTOR(S) : Takashi Michiyoshi It is certified that error appears in the above-identified patent and that said Letters Patent is hereby corrected as shown below:

Replace the Inventor's information on the Title page of the patent with the following:

-- (75) Inventor: Takashi Michiyoshi, Osaka (JP)

Signed and Sealed this
Twenty-first Day of May, 2013

Teresa Stanek Rea
*Acting Director of the United States Patent and Trademark Office*